United States Patent [19]

Paparo et al.

[11] Patent Number: 5,444,291

[45] Date of Patent: Aug. 22, 1995

[54] INTEGRATED BRIDGE DEVICE FOR OPTIMIZING CONDUCTION POWER LOSSES

[75] Inventors: Mario Paparo, San Giovanni la Punta; Natale Aiello, Catania, both of Italy

[73] Assignee: Consorzio per la Ricerca Sulla Microelettronica Nel Mezzogiorno, Catania, Italy

[21] Appl. No.: 979,177

[22] Filed: Nov. 20, 1992

[30] Foreign Application Priority Data

Nov. 25, 1991 [EP] European Pat. Off. ............ 91830513

[51] Int. Cl.$^6$ ...................... H01L 25/07; H01L 29/70
[52] U.S. Cl. .................................. 257/552; 257/566; 257/577
[58] Field of Search ................ 257/500, 502, 503, 552, 257/566, 577, 585, 574, 553, 555

[56] References Cited

U.S. PATENT DOCUMENTS

| | | | |
|---|---|---|---|
| 3,590,345 | 6/1971 | Brewer et al. | 317/235 E |
| 5,065,213 | 11/1991 | Frisina et al. | 257/566 |
| 5,221,855 | 6/1993 | Ferla et al. | 257/503 |
| 5,245,211 | 9/1993 | Paparo et al. | 257/502 |

FOREIGN PATENT DOCUMENTS

| | | | |
|---|---|---|---|
| 0385524 | 9/1990 | European Pat. Off. | 257/552 |
| 0410513 | 1/1991 | European Pat. Off. | 257/566 |
| 3400973 | 7/1985 | Germany . | |
| 0015278 | 2/1977 | Japan | 257/566 |
| 59-149046 | 8/1984 | Japan . | |

OTHER PUBLICATIONS

International Electron Devices Meeting 1987, Dec. 6, 1987, Washington, D.C., pp. 766–769 Design of a high side driver in multipower-BCD and vipower technologies, C. Contiero et al.

Primary Examiner—William Mintel
Assistant Examiner—Peter Toby Brown
Attorney, Agent, or Firm—Felsman, Bradley, Gunter & Dillon

[57] ABSTRACT

An integrated bridge device includes at least two arms, each of which is formed of a first and second diode connected transistor in series. The device is formed in an N+ substrate, which forms a positive output terminal. N− and N type epitaxial layers are formed over the substrate, and P and P+ regions are formed therein for each of the aforesaid arms. An N type region is contained within the P and P+ regions, and in turn contains a P type region forming a negative potential output terminal. Also included in the N type region are N++ regions capable of minimizing the current gain of parasitic transistors formed within the device.

9 Claims, 6 Drawing Sheets

INTEGRATED BRIDGE DEVICE FOR OPTIMIZING CONDUCTION POWER LOSSES

BACKGROUND OF THE INVENTION

1. Field of the Invention

The present invention relates to an integrated bridge device which optimizes conduction power losses.

2. Description of the Prior Art

When converting an electrical signal from alternating to direct current, it is common to utilize a Graetz bridge rectifier circuit. Such circuits consist of two arms, or half bridges, each comprising two diode connected transistors in series. One of the possible applications of this circuit is, for example, the making of a connection between the electronic circuits of a subscriber's telephone set and a two wire telephone line. Although this circuit is commonly used, it has not been possible hitherto to construct it on a single silicon substrate with reasonable operating efficiencies using traditional integration technology.

When constructed in the form of an integrated circuit, parasitic transistors are formed between the two arms of the bridge which cause considerable power losses.

SUMMARY OF THE INVENTION

It is therefore an object of this invention to provide a Graetz bridge device which is integrated monolithically on a single substrate of semiconducting material. It is a further object of this invention to provide such a device which operates at high current levels, is robust, and has a high operating efficiency.

Therefore, in accordance with the present invention, an integrated bridge device includes at least two arms, each of which is formed of a first and second diode connected transistor in series. The device is formed in an N+ substrate, which forms a positive output terminal. N− and N type epitaxial layers are formed over the substrate, and P and P+ regions are formed therein for each of the aforesaid arms. An N type region is contained within the P and P+ regions, and in turn contains a P type region forming a negative potential output terminal. Also included in the N type region are N++ regions capable of minimizing the current gain of parasitic transistors formed within the device.

BRIEF DESCRIPTION OF THE DRAWINGS

The features of this invention will be more clear from a practical embodiment illustrated by way of a non-restrictive example in the appended drawings, in which.

DESCRIPTION OF THE PREFERRED EMBODIMENT

In summary, an integrated bridge device includes at least two arms each formed of a first and second diode connected transistor in series. N− and N type epitaxial layers are formed on an N+ substrate, which in turn forms a positive potential output terminal. For each of the arms of the bridge, P and P+ regions are constructed in the epitaxial layers, and contain within them an N type region. Within the N type regions are formed a P type region forming a negative potential output terminal, and N++ regions capable of minimizing the current gain of parasitic transistors. These parasitic transistors are formed between the P and P+ regions belonging to the first and second bridge arms.

Between the P and P+ regions, there are also preferably formed second P and P+ regions for recovery of residual loss currents of the parasitic transistors. In this manner, the effect of the parasitic transistors which are formed between the P and P+ regions of the first and second arms of the bridge, through the effect of integrated monolithic construction, is reduced. In particular, there is reduction in the dissipated power and a reduction in the voltage drop across the diode transistors forming the two arms of the bridge.

Figure 1:
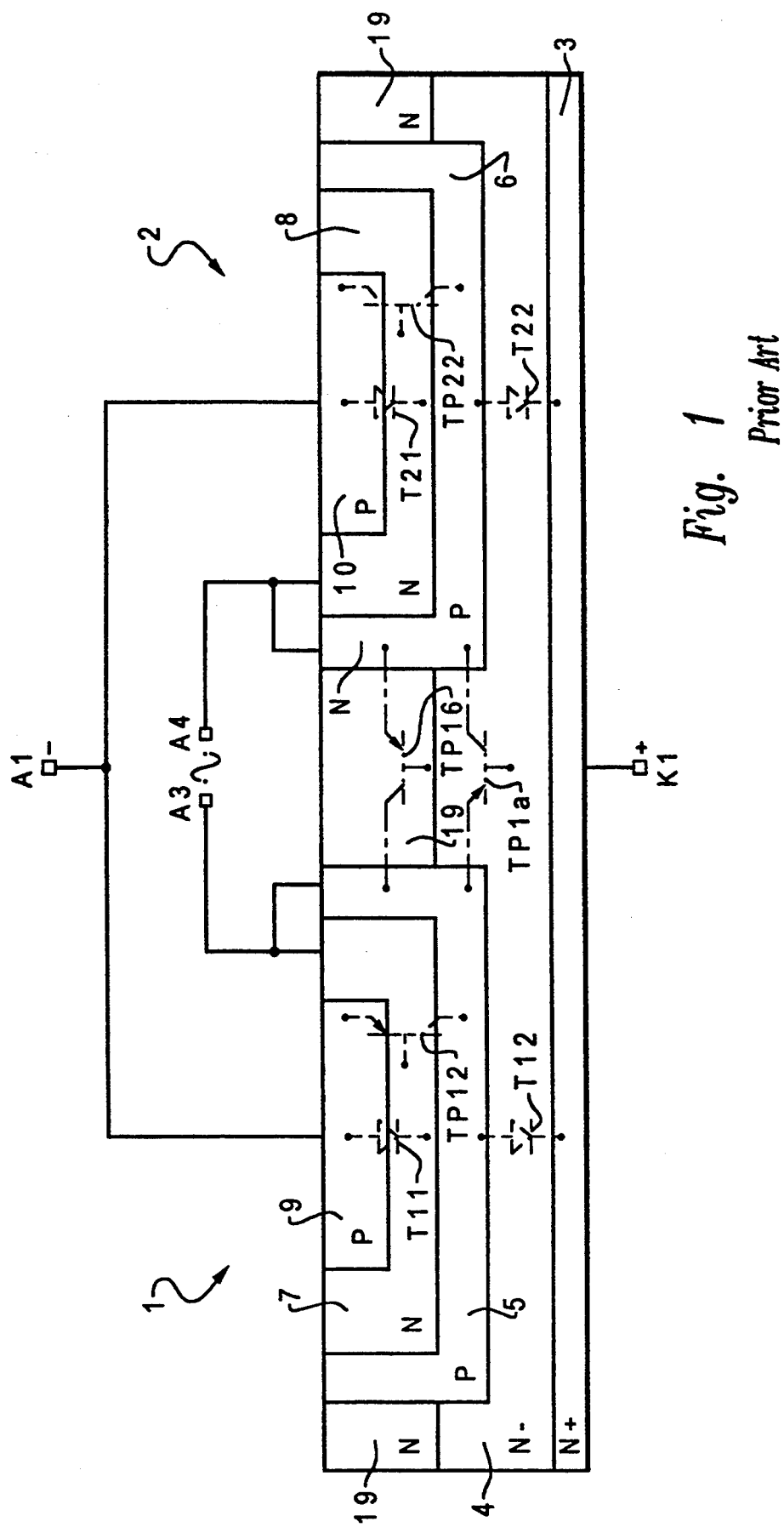
FIG. 1 shows an integrated bipolar embodiment of a Graetz bridge device.

With reference to FIG. 1, an integrated bipolar embodiment of a Graetz bridge rectifier circuit is illustrated. This circuit comprises an N+ substrate 3 which forms a positive potential output terminal K1. On substrate 3 is formed an N− epitaxial layer 4, and an N type surface epitaxial layer 19. For each of the two arms, of the bridge, a P type region 5, 6 is formed in epitaxial layers 4, 19. Within regions 5, 6 are formed N type regions 7, 8. Regions 5 and 6 are short-circuited (in a manner which is not shown in detail) with regions 7, 8, respectively. P type regions 9, 10 are formed within regions 7, 8.

Region 9 represents the emitter of a first transistor T11 of arm 1. This also represents the anode of an equivalent diode formed by transistor T11 through the effect of short-circuiting regions 5 and 7. Regions 5 and 7 form the collector and the base of transistor T11 and therefore the cathode of the aforementioned equivalent diode.

Region 5 also forms the base of a second transistor T12, and region 7 forms the emitter of transistor T12. Region 5 also forms the anode of an equivalent diode constructed from transistor T12 by the effect of short-circuiting regions 5 and 7. The collector of transistor T12, and therefore the cathode of the equivalent diode T12, are formed by regions 3 and 4. Region 10 forms the emitter of a first transistor T21 of arm 2, as well as the anode of an equivalent diode constructed from transistor T21. The diode is formed by short-circuiting regions 6 and 8, which form the collector and base regions of transistor T21, and therefore the cathode of the aforesaid equivalent diode. Region 6 also forms the base of a second transistor T22 of arm 2 as well as the anode of an equivalent diode formed from transistor T22. Region 8 forms the emitter of transistor T22, and the anode of the diode is formed by short-circuiting regions 6 and 8 together. The collector of transistor T22, and therefore the cathode of the aforesaid equivalent diode is formed by regions 3, 4.

Figure 2:
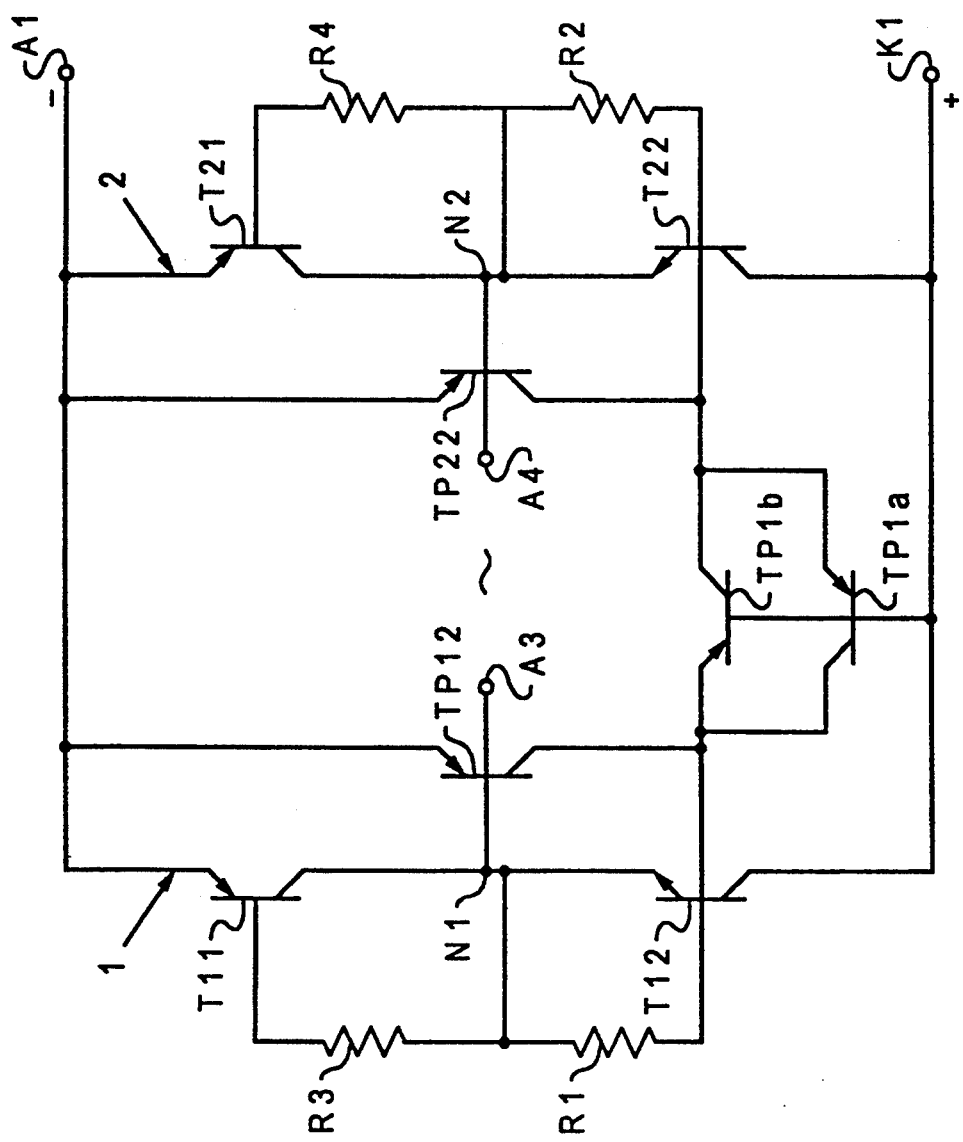
FIG. 2 shows the equivalent circuit diagram of the bipolar construction of FIG. 1.

The equivalent electrical circuit of the integrated structure shown in FIG. 1 is illustrated in FIG. 2. This circuit comprises two arms, or half bridges, 1, 2, each consisting of a first and a second transistor. T11 and T12 form arm 1, and T21 and T22 form arm 2. Transistors T11, T21 of the first and second arms, 1, 2 respectively are diode connected PNP bipolar transistors. These transistors have their base and collector connected together by means of corresponding resistances R3, R4, which are intrinsic to the integrated structure of FIG. 1. The emitters of transistors T11, T21 are both connected to a negative potential output terminal A1. The collectors are connected, at circuit nodes N1, N2, to the emitters of second transistors T12, T22, of the first and second arm respectively. The latter are diode connected NPN bipolar transistors, having their base and emitter connected together by means of corresponding resistances R1, R2 intrinsic to the integrated structure of FIG. 1. The collectors of second transistors T12, T22 are connected to a positive potential output terminal K1.

In the embodiment of the bridge device in the form of a monolithic integrated circuit as in FIG. 1, first parasitic transistors TP1a, TP1b, and second parasitic transistors TP12, TP22, are formed. First parasitic transistors TP1a, TP1b are lateral PNP bipolar transistors. Second parasitic transistors TP12, TP22, are lateral/vertical PNP bipolar transistors.

The bases of transistors TP1a, TP1b, are formed respectively by epitaxial layer 4 and region 19 located between regions 5 and 6. The emitter of transistor TP1a and the collector of transistor TP1b are formed by region 5. The collector of transistor TP1a and the emitter of TP1b are formed by region 6. The bases of second parasitic transistors TP12, TP22 are formed in region 7, 8 respectively. The emitters are formed in regions 9, 10, and the collectors in regions 5, 6.

Returning now to the circuit diagram of FIG. 2, parasitic transistors TP1a, TP1b, are illustrated with their bases connected together and to positive potential output terminal K1. The collector of parasitic transistor TP1a is connected to the emitter of parasitic transistor TP1b, and to the base of transistor T12 of arm 1. The emitter of parasitic transistor TP1a is connected to the collector of parasitic transistor TP1b, and to the base of transistor T22 of arm 2.

Parasitic transistors TP12, TP22, respectively, have their emitters connected to negative potential output terminal A1, and their respective collectors to the bases of transistors T12, T22. Their bases are connected to intermediate nodes N1, N2 between the collectors and emitters respectively of transistor T11 and T12, T21 and T22, and to alternating current inputs A3, A4.

Diode-connected bipolar transistors T12, T21 are connected in series and are conducting when VA3, the voltage at terminal A3, is much greater than VA4, the voltage at terminal A4. In this case, two main factors are responsible for conduction losses. First is parasitic component TP1b, which causes the current from the input generator to recycle. Second, TP22 causes transistor T22 to be activated, reducing the output current available. When the supply voltage is reversed (VA4 greater than VA3) a situation similar to the above arises in which parasitic components TP1a and TP12 are activated correspondingly.

Figure 3:
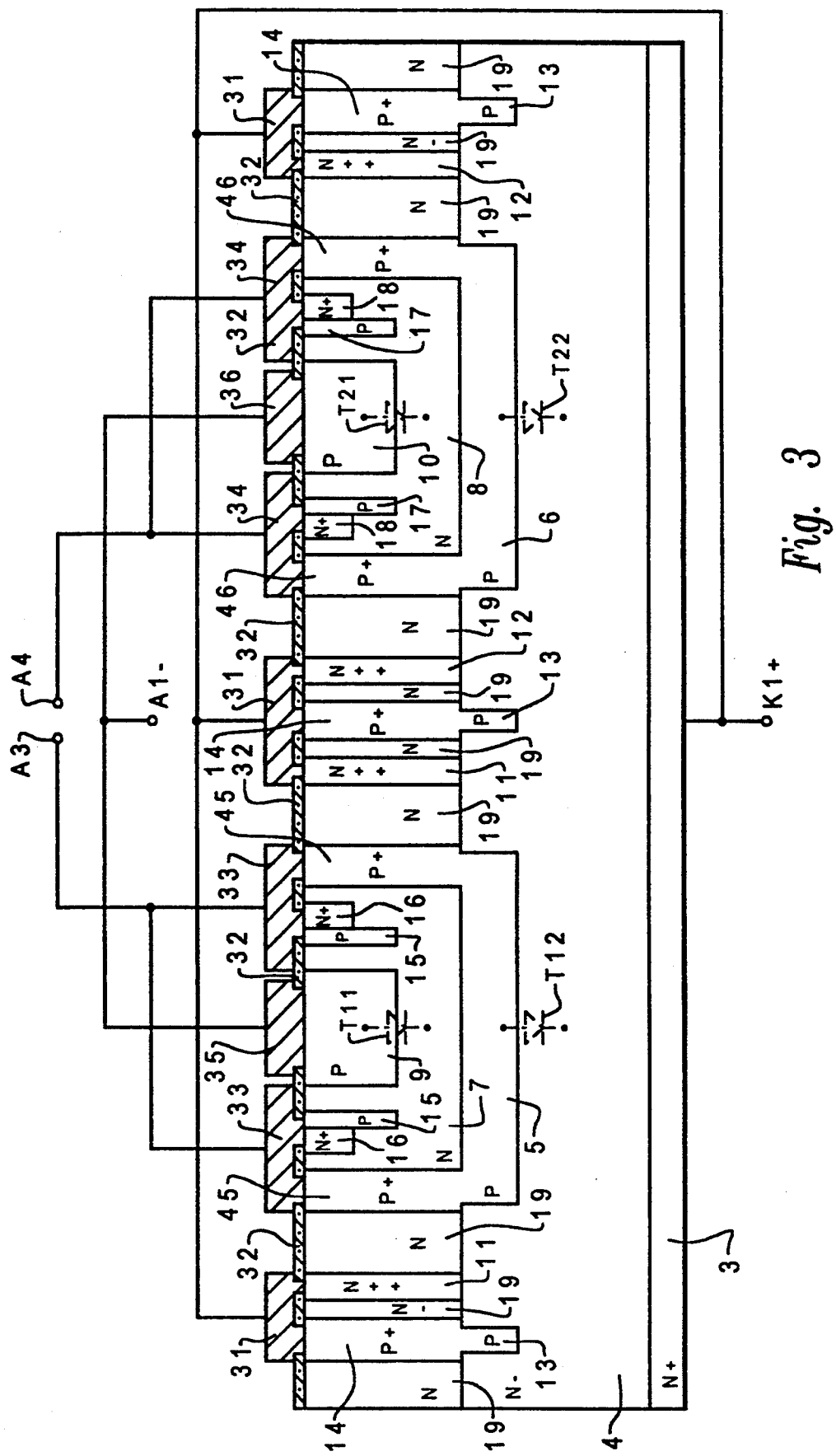
FIG. 3 shows a bipolar integrated embodiment of the Graetz bridge device according to the present invention.

In order to overcome these disadvantages, the integrated embodiment of a device according to the invention is illustrated in FIG. 3. In addition to the regions already described with reference to FIG. 1, this embodiment includes first N++ regions 11, 12. Regions 11, 12 are formed within epitaxial layer 19, between regions 5, 6 and corresponding vertical flanks 45, 46. Regions 11, 12 act to minimize the current gain of first parasitic transistors TP1a, TP1b. Second P type and P+ regions 13, 14, are provided for recovering the residual loss currents from parasitic transistors TP1a, TP1b, and inputting these to positive potential output K1.

Within region 7, P type regions 15 and N+ region 16 are formed. Within region 8, P type region 17 and N+ regions 18 are formed. Region 15 functions to reduce the current passed to regions 5, 45, which coincide with the base of transistor T12 and the anode of the equivalent diode provided by T12. This minimizes the lateral effect of parasitic transistor TP12. Region 17 functions to reduce the current passed to region 6, 46, which coincide with the base of transistor T22 and the anode of the equivalent diode provided by T22, this acts to minimize the lateral effect of parasitic transistor TP22.

The vertical effect of parasitic transistors TP12 and TP22 is reduced by doping regions 5, 6, more heavily in such a way as to reduce the effect of parasitic resistances R1 and R2.

The surface of the device is covered with oxide 32 outside the regions providing the metal connections. In particular, there are metal connections 31 connecting regions 11, 12, 14 to positive potential terminal K1. A metal connection 33 connects regions 15, 16, and 45 to input A3, and a metal connector 34 connects all regions 17, 18, and 46 to input A4. Metal connectors 35, 36 connect regions 9, 10, to negative potential output terminal A1.

Figure 4:
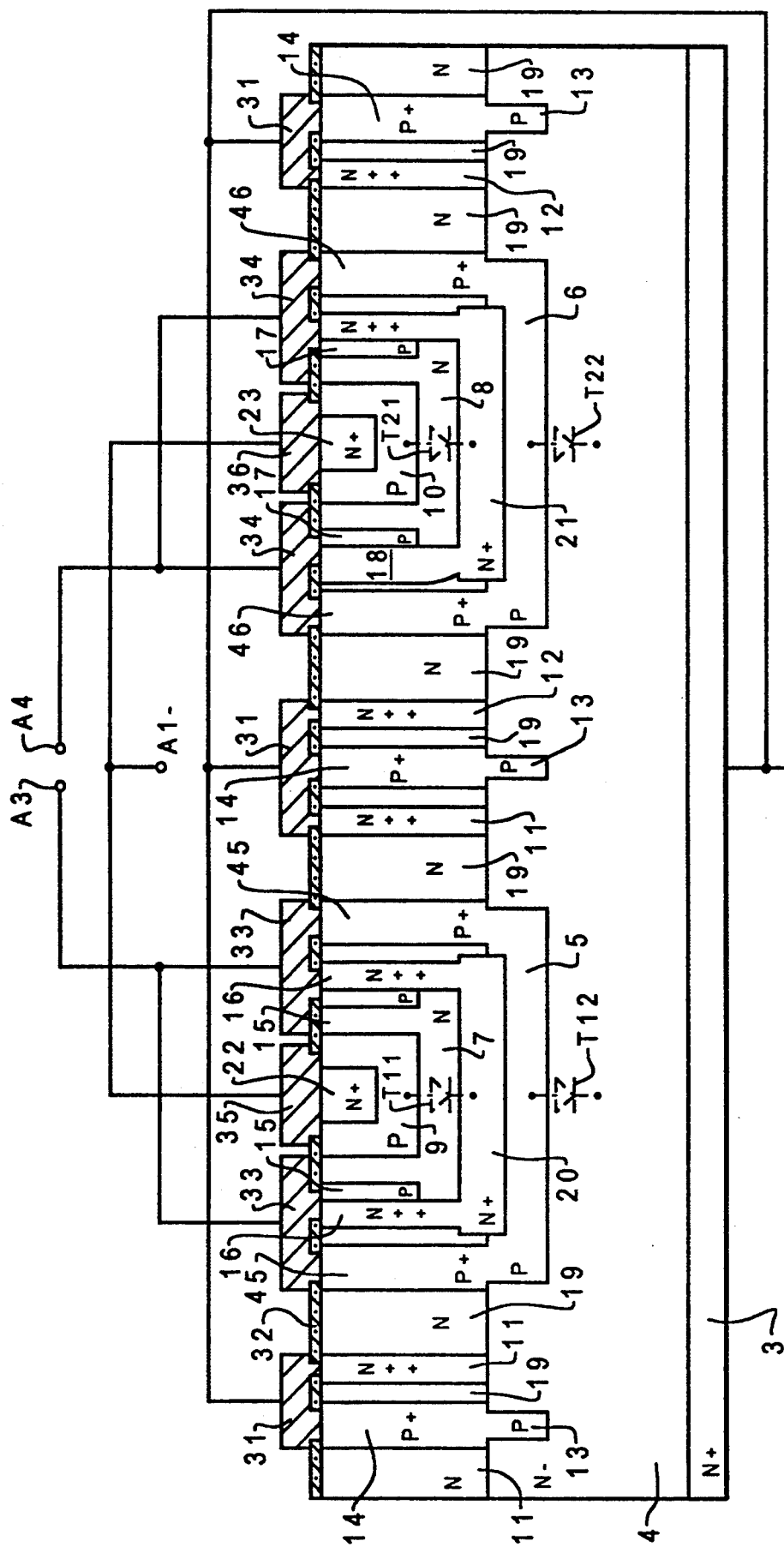
FIG. 4 shows an alternative integrated embodiment of the device according to the invention.

FIG. 4 differs from FIG. 3 in that regions 16, 18, extend in depth to horizontal layers 20, 21, so as to reduce the vertical component of the gain of parasitic transistors TP22, TP12. The lateral components of such gains are reduced by means of regions 16, 18.

Within regions 9, 10, are formed regions 22, 23, which improve the operating efficiency of diode-connected bipolar series transistors T11, T21. Region 22 and regions 9, 7, and 20 form the emitter, base and collector junctions of an NPN vertical flow transistor capable of increasing the switching rate of diode-connected bipolar transistor T11. The same is true of region 23 together with regions 10, 8, and 21 with respect to diode-connected bipolar transistor T21. Metal connectors, 35, 36, also connect regions 22, 23 to negative potential terminal A1.

Figure 5:
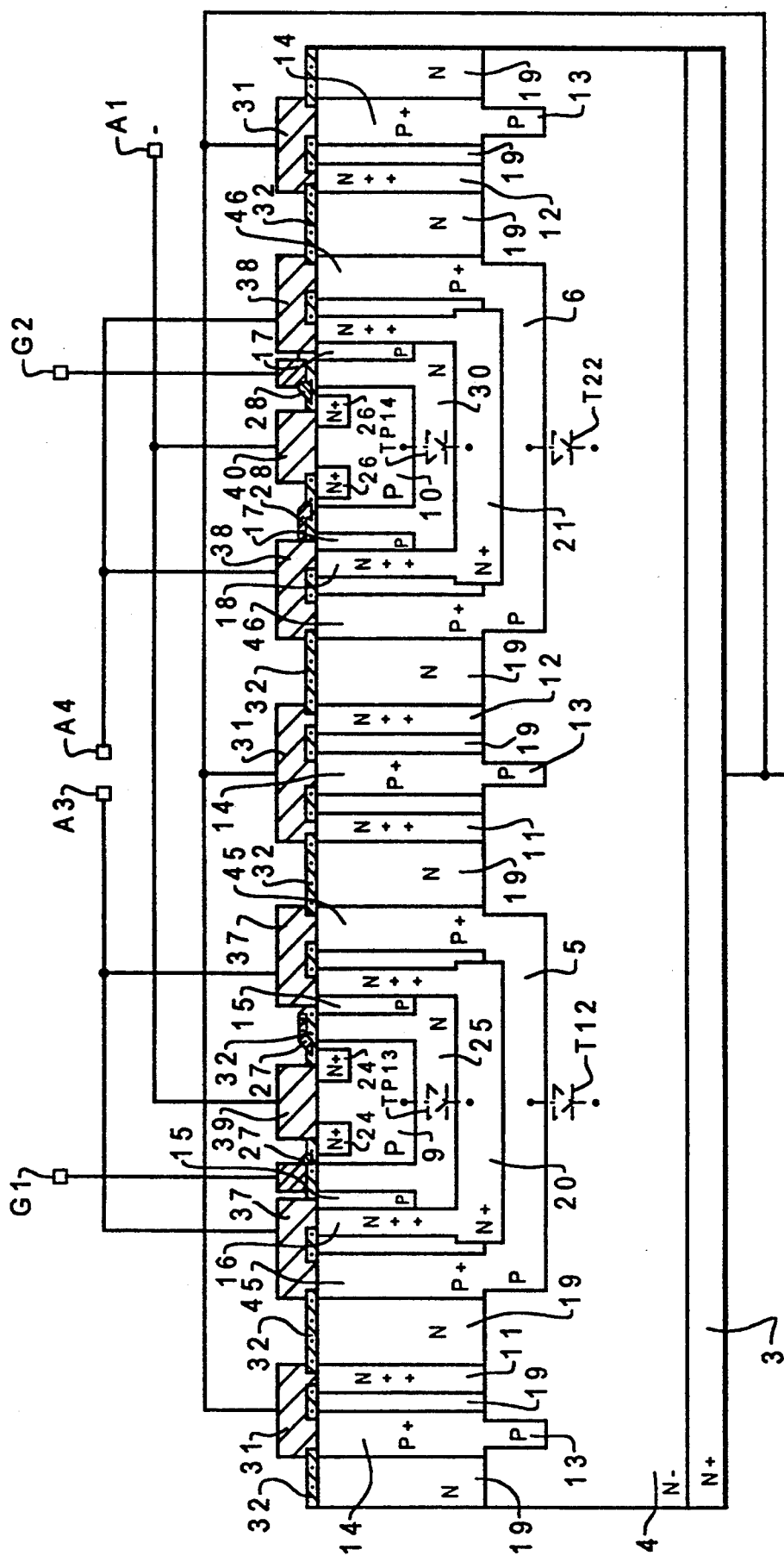
FIG. 5 shows a mixed bipolar and MOS integrated embodiment of the device according to the invention.
Figure 6:
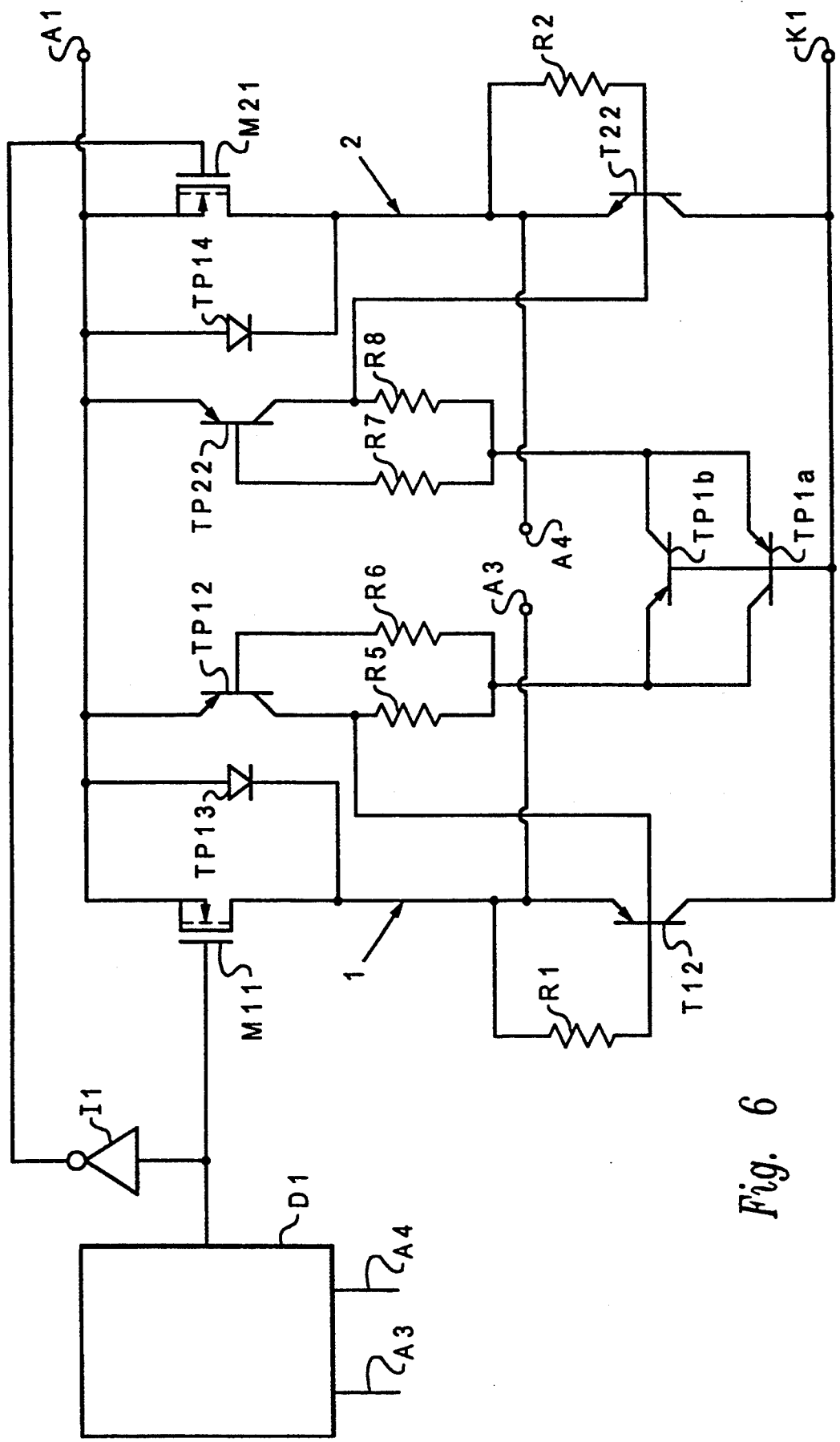
FIG. 6 shows the equivalent circuit diagram of the mixed bipolar and MOS construction of FIG. 5.

FIG. 5 shows a mixed bipolar/MOS integrated embodiment of the device according to the invention. Its equivalent electrical circuit is illustrated in FIG. 6. The circuit of FIG. 6 differs from that in FIG. 2 essentially in that vertical current flow MOS transistors M11, M21 are present, and an isolated drain replaces bipolar transistors T11, T12.

The gates of transistors M11, M22 are controlled, directly and through an inverter I1, by a piloting or driver device D1. Driver device D1 uses known techniques to cause M11 or M21, respectively, to conduct, measuring the difference VA3−VA4 in the input voltages of the inverter circuit respectively. The sources of transistors M11, M22 are connected to output A1, and the drains are connected to the emitters of transistors T12, T22.

Parasitic transistors TP1a, TP1b, TP12, and TP22 are shown in the equivalent electrical diagram of FIG. 6. These parasitic transistors are formed in the monolithic integrated embodiment shown in FIG. 5, and their effects are reduced by means of the techniques previously described.

The emitter of transistor TP1b is connected to the collector of transistor TP1a. It is also connected through intrinsic resistances R5, R6, respectively to the collector and base of parasitic transistor TP12. The collector of transistor TP1b is connected to the emitter of transistor TP1a. It is also connected, through intrinsic resistances R7, R8, to the base and collector of parasitic transistor TP22.

In the integrated embodiment, further diode-connected bipolar parasitic transistors TP13, TP14 are placed in series between the source and the drain of corresponding MOS transistors M11, M21. The anodes of the equivalent diodes formed by parasitic transistors TP13, TP14 are connected to the sources of MOS transistors M11, M21. The cathodes of the equivalent diodes are connected to the drains of the same MOS transistors.

With reference to FIG. 5, this embodiment differs from that shown in FIG. 4 in the presence of regions corresponding to MOS transistors M11, M21. It further differs in the formation of parasitic transistors TP13, TP14, and in the absence of regions 22, 23 shown in FIG. 4.

MOS transistor M11 is formed by N+ source regions 24 contained within region 9 forming the body. The drain is formed by a weakly doped region 25 and enriched region 20. The gate is a region 27 embedded in the insulator. The gate electrode is indicated by G1.

MOS transistor M21 is formed by N+ source regions 26 located within region 10, which forms the body of the transistor. The drain is formed from a weakly doped region 30 and an enriched region 21. The gate is a region 28 embedded in the insulator. The gate electrode is indicated by G2.

Regions 9, 20 represent the base connected to the emitter and the collector of parasitic transistor TP13. Regions 10, 21, represent the base connected to the emitter and collector of parasitic transistor TP14. Instead of metal connectors 33, 34, 35, and 36, there are formed metal connectors 37 and 38 which connect all regions 16, 18, 45, and 46, to corresponding inputs A3, A4. Additionally, metal connectors 39, 40 connect all regions 9, 10, 24, and 26 to negative potential terminal A1.

In this circuit, a low drain-source resistance is associated with transistors M11, M21 when these are conducting. This brings about a drastic reduction in the voltage drop at the junctions of diode-connected bipolar series transistors TP13, TP14. The effect of parasitic transistors TP12, TP22 is not taken into consideration, because it is so drastically reduced by the structure forming the MOS transistors.

Driving of the device is adequate to avoid simultaneous conduction of M11 and M21 so that the operation efficiency loss due to TP12 and TP22 in the configuration of FIG. 2 is reduced. The system thus forms an asychronous detector. Drive circuit D1 does not require further supply voltages because the drive voltages for gates G1, G2 may be less than that available on terminal K1.

The structures to which the invention relates, and all their embodiment configurations, can be used in multiphase circuits. Additionally, the number of bridge arms can vary from a minimum of one to N. The maximum power rating and the total number of bridge arms which can be integrated are a function of the dimensions of the substrate used.

If desired, the same monolithic structure may also include one or more further P type and P+ regions such as 5, 45 which are connected to a potential which is not greater than the potential of substrate 3. One or more components of the control and drive device for the two arms of the bridge can be fabricated in such further regions.

While the invention has been particularly shown and described with reference to a preferred embodiment, it will be understood by those skilled in the art that various changes in form and detail may be made therein without departing from the spirit and scope of the invention.

What is claimed is:

1. An integrated bridge device having at least first and second arms, each formed of first and second diode-connected bipolar transistors, in series, comprising an N+ type substrate forming a positive potential output terminal, an N− type epitaxial layer on the N+ substrate, a further N type epitaxial layer formed on the N− epitaxial layer and, for each of the aforesaid arms, a first P type region formed in the N− epitaxial layer and a first P+ type region formed in the N type epitaxial layer, wherein the first P and P+ regions contain within them an N type region, which in turn contains an interior P type region forming a negative potential output terminal, and further including first N++ type regions within the N type epitaxial layer for minimizing the current gain of parasitic transistors formed surrounding the first P type and P+ type regions belonging to the first and second arms.

2. The integrated bridge device of claim 1, wherein the first P type region of each of the first and second arms of the bridge has additional doping to reduce the gain and the distributed resistance of a base of the second transistor in each of the first and second arms.

3. The integrated bridge device of claim 1, wherein the at least first and second arms comprise a plurality of arms to form a multiphase circuit.

4. An integrated bridge device having at least first and second arms, each formed of first and second diode-connected bipolar transistors, in series, comprising an N+ type substrate forming a positive potential output terminal, an N− type epitaxial layer on the N+ substrate, a further N type epitaxial layer formed on the N− epitaxial layer and, for each of the aforesaid arms, a first P type region formed in the N− epitaxial layer and a first P+ type region formed in the N type epitaxial layer, wherein the first P and P+ regions contain within them an N type region, which in turn contains an interior P type region forming a negative potential output terminal, and further including first N++ type regions within the N type epitaxial layer for minimizing the current gain of parasitic transistors formed surrounding the first P type and P+ type regions belonging to the first and second arms, and further comprising second regions of P type and P+ type, located in the N− epitaxial layer and the N type epitaxial layer respectively, for recovering the residual loss currents from said parasitic transistors, which are formed adjacent to the N++ regions.

5. An integrated bridge device having at least first and second arms, each formed of first and second diode-connected bipolar transistors, in series, comprising an N+ type substrate forming a positive potential output terminal, an N− type epitaxial layer on the N+ substrate, a further N type epitaxial layer formed on the N− epitaxial layer and, for each of the aforesaid arms, a first P type region formed in the N− epitaxial layer and a first P+ type region formed in the N type epitaxial layer, wherein the first P and P+ regions contain within them an N type region, which in turn contains an interior P type region forming a negative potential output terminal, and further including first N++ type regions within the N type epitaxial layer for minimizing the current gain of parasitic transistors formed surrounding the first P type and P+ type regions belonging to the first and second arms, wherein for each of the first and second arms, in the N type region there is formed a third P type region, capable of reducing the current inputted into the first P type and P+ type regions, coinciding with the parasitic transistor having a transistor base connected to an emitter of the second transistor of the arm, to reduce effects of a further parasitic transistor with a base formed in the N type region, a collector formed in the P+ type region, and an emitter formed in the interior P type region.

6. An integrated bridge device having at least first and second arms, each formed of first and second diode-connected bipolar transistors, in series, comprising an N+ type substrate forming a positive potential output terminal, an N− type epitaxial layer on the N+ substrate, a further N type epitaxial layer formed on the N− epitaxial layer and, for each of the aforesaid arms, a first P type region formed in the N− epitaxial layer and a first P+ type region formed in the N type epitaxial layer, wherein the first P and P+ regions contain within them an N type region, which in turn contains an interior P type region forming a negative potential output terminal, and further including first N++ type regions within the N type epitaxial layer for minimizing the current gain of parasitic transistors formed surrounding the first P type and P+ type regions belonging to the first and second arms, and further comprising, for each arm, in the N type region near the first P type region, a pair of N+ type regions capable of reducing the vertical component of the gain of a further parasitic transistor, said N+ type regions extending to a surface of the device and also capable of reducing the lateral components of the gain of said further parasitic transistor.

7. An integrated bridge device having at least first and second arms, each formed of first transistor and a second, diode-connected, bipolar transistor, in series, comprising an N+ type substrate forming a positive potential output terminal, an N− type epitaxial layer on the N+ substrate, a further N type epitaxial layer formed on the N− epitaxial layer and, for each of the aforesaid arms, a first P type region formed in the N− epitaxial layer and a first P+ type region formed in the N type epitaxial layer, wherein the first P and P+ regions contain within them an N type region, which in turn contains an interior P type region forming a negative potential output terminal, and further including first N++ type regions within the N type epitaxial layer for minimizing the current gain of parasitic transistors formed surrounding the first P type and P+ type regions belonging to the first and second arms, and wherein the first transistor of each of the two arms is a MOS type transistor with a vertical current flow and an isolated drain formed from a pair of N+ source regions embedded in the interior P type region, and drain regions formed from the N type region and a third N+ region formed between the N type region and the first P type region.

8. An integrated bridge device having at least first and second arms, each formed of first and second diode-connected bipolar transistors, in series, comprising an N+ type substrate forming a positive potential output terminal, an N− type epitaxial layer on the N+ substrate, a further N type epitaxial layer formed on the N− epitaxial layer and, for each of the aforesaid arms, a first P type region formed in the N− epitaxial layer and a first P+ type region formed in the N type epitaxial layer, wherein the first P and P+ regions contain within them an N type region, which in turn contains an interior P type region forming a negative potential output terminal, and further including first N++ type regions within the N type epitaxial layer for minimizing the current gain of parasitic transistors formed surrounding the first P type and P+ type regions belonging to the first and second arms, and further comprising, for each arm, between the N type region and the first P type region, an N+ type region, and between the first P+ regions and the N type region, second N++ regions connected to the N+ region and extending to a surface of the N type epitaxial layer, wherein the N+ region and the second N++ regions are capable of reducing the vertical and lateral components of the gain of a further parasitic transistor.

9. The integrated bridge device of claim 8, wherein, for each arm, there is, within the interior P type region, a second N+ region, the second N+ region together with the N+ region and the interior P type region representing an emitter, base and collector of a vertical current flow transistor capable of improving the conversion efficiency of said first transistor of each of the two arms.

* * * * *